United States Patent [19]

Takashita

[11] Patent Number: 5,721,455
[45] Date of Patent: Feb. 24, 1998

[54] SEMICONDUCTOR DEVICE HAVING A THERMAL RESISTANCE DETECTOR IN THE HEAT RADIATING PATH

[75] Inventor: Masakatsu Takashita, Yokohama, Japan

[73] Assignee: Kabushiki Kaisha Toshiba, Kawasaki, Japan

[21] Appl. No.: 752,548

[22] Filed: Nov. 20, 1996

[30] Foreign Application Priority Data

Nov. 21, 1995 [JP] Japan .................... 7-302905

[51] Int. Cl.$^6$ .............. H01L 29/78; H01L 23/48; H01L 23/16
[52] U.S. Cl. .............. 257/713; 257/724; 257/725; 257/177; 257/178; 257/84; 257/226; 257/293; 257/723; 257/717; 257/712
[58] Field of Search .............. 257/712, 706, 257/707, 711, 713, 717, 720, 723, 724, 693, 674, 675, 676, 48, 80-84, 116-118, 177, 178, 222, 225-229, 238, 293, 725

[56] References Cited

U.S. PATENT DOCUMENTS

| | | |
|---|---|---|
| 4,125,777 | 11/1978 | O'Brien et al. ............... 257/81 |
| 4,920,405 | 4/1990 | Itoh et al. ............... 257/724 |
| 5,172,215 | 12/1992 | Kobayashi et al. ............... 257/724 |
| 5,291,065 | 3/1994 | Arai et al. ............... 257/691 |
| 5,398,160 | 3/1995 | Umeda ............... 257/713 |
| 5,444,297 | 8/1995 | Oshima et al. ............... 257/691 |
| 5,519,252 | 5/1996 | Soyano et al. ............... 257/691 |
| 5,539,254 | 7/1996 | Eytcheson et al. ............... 257/713 |
| 5,541,453 | 7/1996 | Stockmeier et al. ............... 257/724 |
| 5,559,374 | 9/1996 | Ohta et al. ............... 257/724 |

Primary Examiner—Sara W. Crane
Assistant Examiner—Alexander Oscar Williams
Attorney, Agent, or Firm—Finnegan, Henderson, Farabow, Garrett & Dunner, L.L.P.

[57] ABSTRACT

In a semiconductor device comprising a semiconductor chip on which semiconductor elements are formed, the semiconductor device further comprises a thermal resistance detector for detecting an increase of thermal resistance of a heat radiating path which is provided to radiate the heat generated in the semiconductor device during operation, and a thermal resistance detection result output circuit for outputting a result of a detection by the thermal resistance detector to an output of the semiconductor device. The semiconductor device can detect at the early stage the increase of the thermal resistance of the heat radiating path, and the deterioration of the semiconductor device due to the crack in the solder layer bonding the chip mounting insulation substrate and heat sink during the operation of the device.

5 Claims, 3 Drawing Sheets

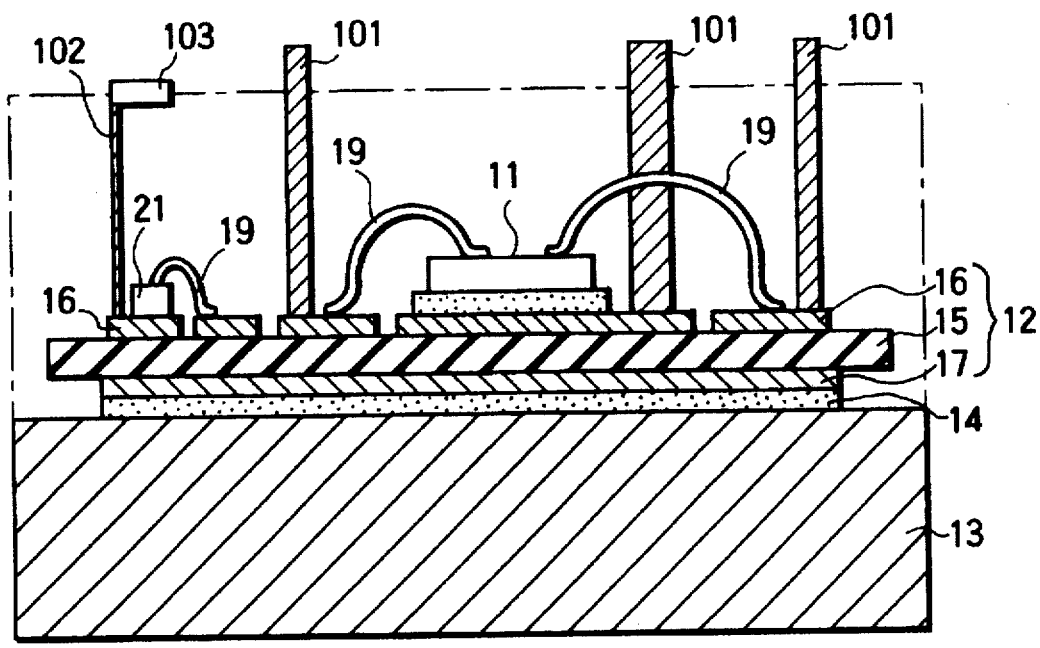
F I G. 6

SEMICONDUCTOR DEVICE HAVING A THERMAL RESISTANCE DETECTOR IN THE HEAT RADIATING PATH

BACKGROUND OF THE INVENTION

1. Field of the Invention

This invention relates to a semiconductor device, particularly to a power semiconductor element such as an IGBT (Insulated Gate Bipolar Transistor), in which an insulation substrate holding a semiconductor chip and a heat sink are soldered each other to improve the efficiency of radiating the heat generated in the power semiconductor element.

2. Description of the Related Art

FIG. 7 is a sectional view of the conventional power semiconductor device.

As shown in FIG. 7, the device comprises a semiconductor chip 11 incorporating power semiconductor elements (not shown), a chip holding insulation substrate 12 having high thermal conductivity, a heat sink 13 formed of, for example, Cu-based material, and a solder layer 14 bonding the substrate 12 and the heat sink 13 together.

The chip holding insulation substrate 12 comprises an insulating plate 15 made of material such as ceramics or the like. Metal patterns 16 made of metal such as Cu are formed on the chip mounting surface of the insulating plate 15. A metal layer 17 made of a material such as Cu is formed on the back surface of the insulating plate 15. The metal patterns 16 are used as chip mounting patterns and terminal connecting patterns.

The chip 11 is bonded on the chip mounting pattern 16 by a first solder layer 18. The terminal connecting patterns 16 are bonded to pad sections (not shown) of the chip 11 by bonding wires 19, and the metal layer 17 is bonded to the heat sink 13 by a second solder layer 14.

Shown in FIG. 7 are main terminals 101 of the power system and signal processing system. The main terminals are connected to the patterns 16 with solder.

The chip holding insulation substrate 12 having high thermal conductivity is interposed between the power semiconductor chip 11 and the heat sink 13. The power semiconductor chip 11 and the chip holding insulation substrate 12 are bonded by the first solder layer 18. The chip holding insulation substrate 12 and the heat sink 13 are bonded by the second solder layer 14. By virtue of this structure, the heat generated in the chip 11 can be radiated efficiently, without adversely affecting the insulation of the power semiconductor chip 11.

Incidentally, the power semiconductor device generates a large amount of heat. Therefore, the thermal resistance of the heat radiating path provided to radiate the heat generated in the device during the operation of the device is increased. Consequently, the device may have some deficiency such as the increase of the heat loss or the thermal destruction.

In the structure in which the chip holding insulation substrate 12 having the ceramic insulating plate 15 bonded on its surfaces to the Cu films 16 and 17 is soldered to the heat sink 13 made of Cu-based material, expansion and contraction are repeated through the temperature cycles due to the difference in thermal expansion coefficient of the chip holding insulation substrate 12 and the heat sink 13. As the result, the second solder layer 14 bonding the substrate 12 and the heat sink 13 together in the heat radiating path is fatigued, and the solder layer 14 eventually has cracks which will weaken the solder layer 14. When the solder layer 14 has the cracks, its thermal resistance will increase. This results in an increase of the thermal resistance of the entire heat radiating path, and efficient heat radiation can no longer be possible. The heat rapidly accumulates in the semiconductor device having such a deficiency, resulting in the thermal destruction.

As described above, the conventional power semiconductor device having the chip mounting insulation substrate soldered to the heat sink, may have some deficiency due to the increase in the thermal resistance of the heat radiating path for radiating the heat generated in the device during the operation of the device.

SUMMARY OF THE INVENTION

The present invention intends to solve the above-mentioned problem and has its object to provide a power semiconductor device in which the increase of the thermal resistance of the heat radiating path which is provided to radiate the heat generated in the device is detected, thereby detecting the deterioration of the semiconductor device due to the crack in the solder layer which bonds the chip mounting insulation substrate and the heat sink, during the operation of the device.

A semiconductor device according to an aspect of the present invention comprises:

a semiconductor chip on which semiconductor elements are formed;

a heat sink;

an insulation substrate having high thermal conductivity, being provided between the semiconductor chip and the head sink so as to hold the semiconductor chip;

a solder layer for bonding the insulation substrate and the head sink;

thermal resistance detection means for detecting an increase of thermal resistance of a heat radiating path which is provided to radiate the heat generated in the semiconductor device during operation; and thermal resistance detection result output means for outputting a result of a detection by the thermal resistance detection means to an output of the semiconductor device.

The thermal resistance detection means may determine on the basis of temperature detection output of one or a plurality of temperature detection element/elements arranged at least on a periphery of the insulation substrate that the thermal resistance in the heat radiating path is higher than a reference value.

The thermal resistance detection means may determine that the thermal resistance in the heat radiating path is higher than a reference value on the basis of an electric characteristics output depending on a thermal resistance of one or a plurality of temperature detection element/elements arranged at least on a periphery of the insulation substrate.

The thermal resistance detection means may determine that the thermal resistance in the heat radiating path is higher than a reference value by use of temperature detection element/elements arranged on a periphery of the semiconductor chip.

A semiconductor device according to another aspect of the present invention comprises:

a semiconductor chip on which semiconductor elements are formed;

an insulation substrate having an element mounting surface on which a metal pattern is formed, and a back surface on which a metal layer is formed;

a first solder layer for bonding the insulation substrate to the semiconductor chip in a state where the semiconductor chip is mounted on the metal pattern for mounting the chip;

bonding wires provided between the metal pattern on the insulation substrate for mounting the semiconductor chip and a pad section of the semiconductor chip;

a heat sink;

a second solder layer for bonding the metal on the back surface of the insulation substrate to the heat sink in a state where the metal on the back surface of the insulation substrate contacts on the heat sink;

thermal resistance detection means for detecting an increase of thermal resistance of a heat radiating path which is provided to radiate the heat generated in the semiconductor device during operation; and thermal resistance detection result output means for outputting a result of a detection by the thermal resistance detection means to an outside of the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a sectional view of a power semiconductor device according to a second embodiment of the present invention, in which another example of the thermal resistance detection result output means is provided.

DETAILED DESCRIPTION OF THE PREFERRED EMBODIMENTS

This invention can be more fully understood from the following detailed description when taken in conjunction with the accompanying drawings.

Figure 1:
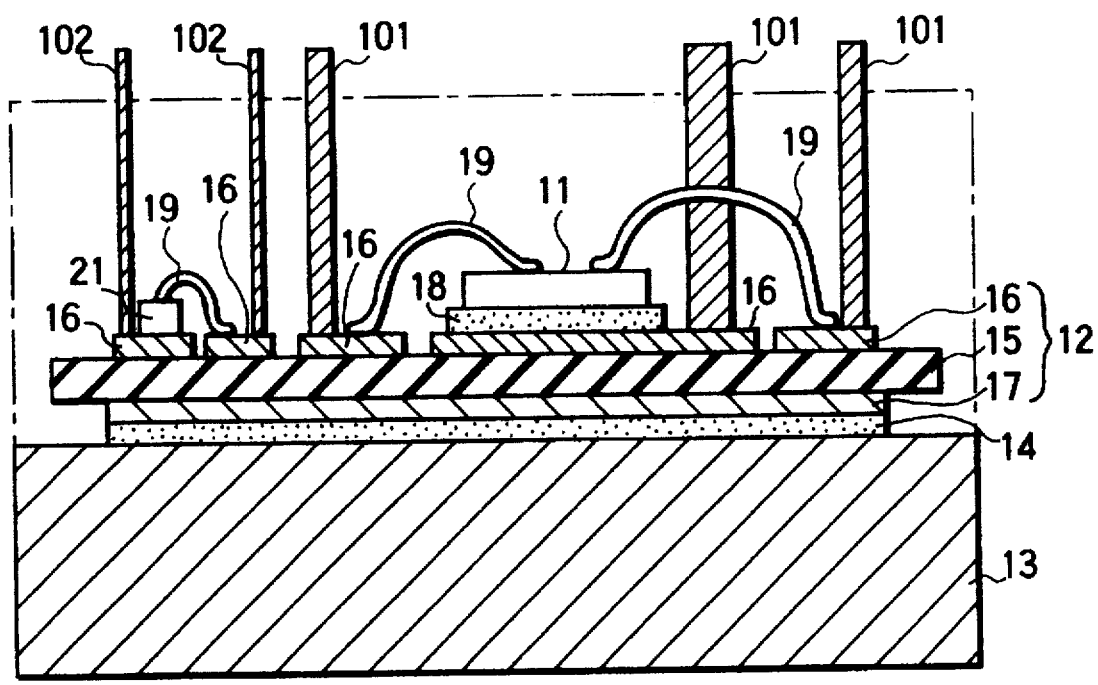
FIG. 1 is a sectional view of a power semiconductor device according to a first embodiment of the present invention, which includes thermal resistance detection means and thermal resistance detection result output means.

FIG. 1 shows a section of the power semiconductor device according to a first embodiment of the present invention.

In the power semiconductor device shown in FIG. 1, a chip holding insulation substrate 12 with high thermal conductivity is provided between a semiconductor chip 11 on which the power semiconductor elements (not shown) are formed and a heat sink 13 formed of Cu-based material, for example. The semiconductor chip 11 and the chip holding insulation substrate 12 are bonded by a first solder layer 18, and the chip holding insulation substrate 12 and a heat sink 13 are bonded by a second solder layer 14.

The chip holding insulation substrate 12 comprises an insulating plate 15 made of material such as ceramics. Metal patterns 16 which are formed of metal such as Cu are located on a chip mounting surface of the insulating plate 15. A metal layer 17 formed of a material such as Cu is located on a back surface of the insulating plate 15.

The chip 11 is bonded on the chip mounting pattern 16 by a first solder layer 18. The terminal connecting patterns 16, which are connected to main terminals 101, are bonded to pad sections (not shown) of the chip 11 by bonding wires 19, and a metal layer 17 is bonded to the heat sink by a second solder layer 14.

In this figure, 101 denotes main terminals of the power system and the signal processing system. The main terminals are bonded by solder to the terminal connecting patterns 16 for connecting the main terminals 101.

To sum up, the power semiconductor device shown in FIG. 1 comprises: the semiconductor chip 11 on which the semiconductor elements (not shown) are formed; the chip holding insulation substrate 12 having metal patterns 16 on the element mounting surface of the insulating plate 15 and a metal layer 17 formed on the back surface of the insulating plate 15; the solder layer 18 bonding the chip mounting pattern 16 on the chip holding insulation substrate 12 to the semiconductor chip 11; bonding wires 19 connected between the metal patterns 16 and the pad sections (not shown) of the semiconductor chip 11; the heat sink 13; and the second solder layer 14 bonding the heat sink 13 to the metal layer 17 formed on the back surface of the insulating layer 15.

The semiconductor device of the present invention further comprises the thermal resistance detection means for detecting an increase of the thermal resistance of the heat radiating path which is provided to radiate the heat generated in the semiconductor device during operation, and the thermal resistance result detection means for outputting a result of a detection by the thermal resistance detection means to an output of the semiconductor device.

It has been reported by Wuchen Wu, Marcel Held, et al. in "Thermal Stress Related Packaging Failure in Power IGBT Modules", Proceedings of 1995 International Symposium on Power Semiconductor Devices & ICs, Yokohama, 1995, May-24, pp.330–334, for example, that the deterioration of the solder layer due to the crack in the solder layer bonding the insulation substrate and the heat sink occurs at the periphery of the solder layer at first.

Figure 3A:
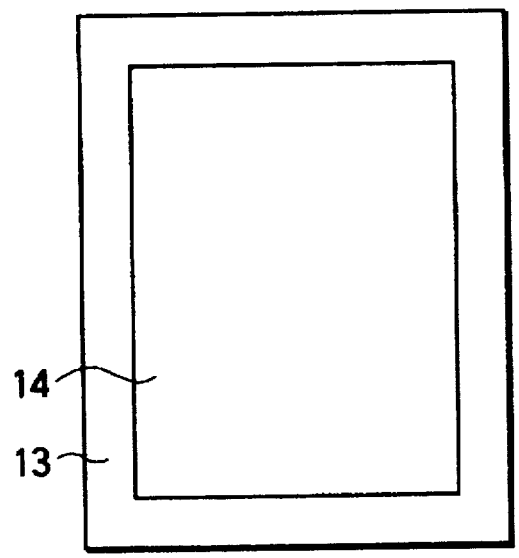
FIGS. 3A and 3B show the states of the second solder layer formed between the insulation substrate and heat sink shown in FIG. 1 before and after the temperature cycles.
Figure 3B:
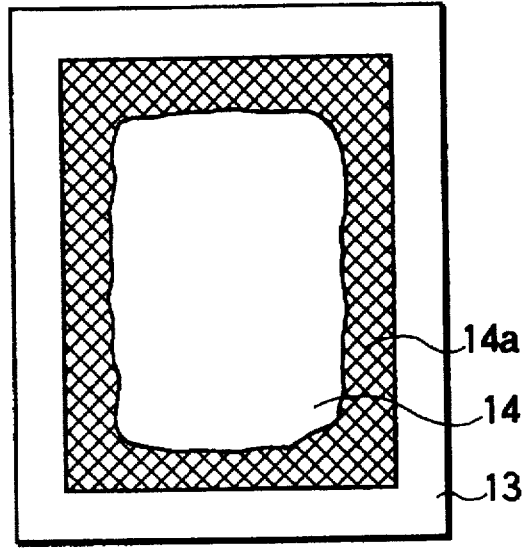

The examples of the states of the second solder layer 14 formed between the insulation substrate 12 and the heat sink 13 before and after the temperature cycles are shown in FIGS. 3A and 3B. FIG. 3B shows that the void region 14a (the region deteriorated due to the occurrence of the crack and the like) exists on the periphery of the second solder layer 14 after the temperature cycles.

Figure 2:
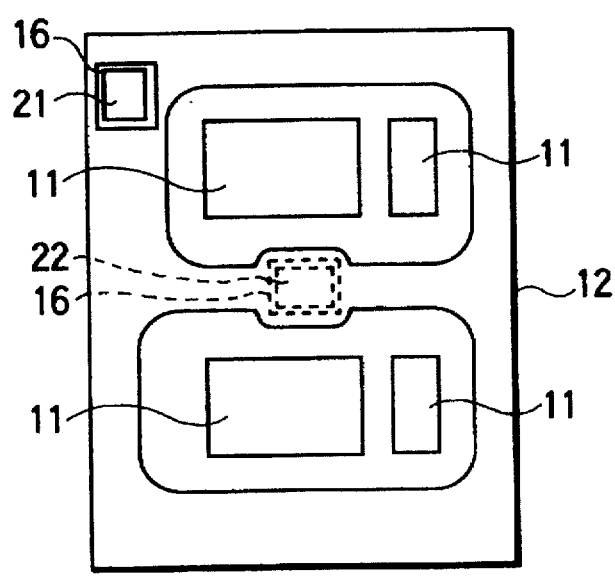
FIG. 2 is a schematic plan view of an example of the pattern on the insulation substrate of the semiconductor device shown in FIG. 1, in which a temperature detection element is arranged on the insulation substrate.

FIG. 2 is a schematic plan view of an example of the pattern on the insulation substrate shown in FIG. 1.

The thermal resistance detection means can be constituted, as follows:

In one example as shown in FIGS. 1 and 2, in order to detect that the thermal resistance exceeds a predetermined value, one or a plurality of temperature sensing element/elements 21 such as thermistor and diode are arranged on at least the periphery of the insulation substrate 12. In this example, if a crack 14a has occurred on the periphery of the second solder layer 14 as shown in FIG. 3B, the thermal radiating efficiency will decrease and the temperature of the heat radiating path increases. The increase of the thermal resistance of the heat radiating path is detected by the temperature detection element 21 provided on the periphery of the insulation substrate 12.

When one temperature detection element 21 is provided only on the periphery of the insulation substrate 12 as indicated by the solid line in FIG. 2, the output from the temperature detection element 21 is compared with a reference value by a comparator (not shown), and when the detected value exceeds the reference value, it is determined that the thermal resistance of the heat radiating path is higher than the reference value.

As shown by a broken line in FIG. 2, when at least one temperature detection element 22 is provided to the portion other than the periphery of the insulation substrate 12 (e.g. the central portion of the insulation substrate 12) in addition to the one temperature detection element 21 provided on the periphery of the insulation substrate 12, the output of the temperature detection element 22 is used as a reference value. More specifically, the detection element 21 arranged on the periphery of the insulation substrate 12 is compared with the output of the temperature detection element 22 arranged on the portion other than the periphery of the insulation substrate 12 (i.e., compared with the reference value), and when the output of the temperature detection element 21 exceeds the output of the temperature detection element 22, it is determined that the thermal resistance of the heat radiating path is higher than a predetermined value. As should be clear from this, the detection output of the temperature detection element 22 is used as a reference value for determination.

Figure 4:
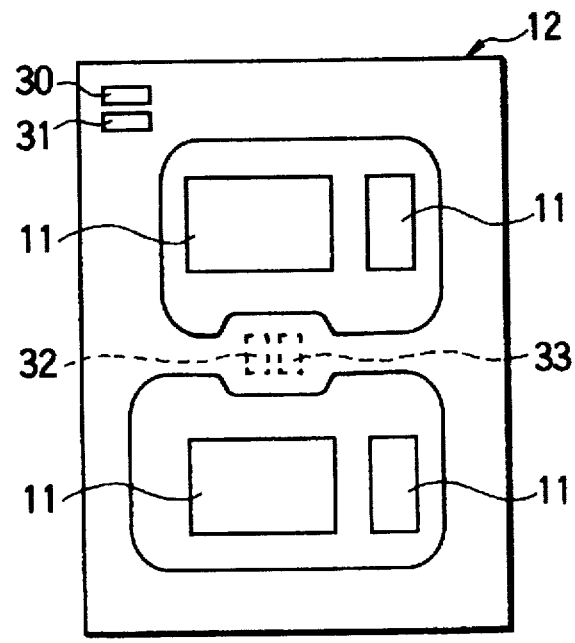
FIG. 4 is a schematic plan view of another example of the pattern on the insulation substrate of the semiconductor device shown in FIG. 1, in which a thermal resistance detection element and a thermal resistance measuring circuit are arranged on the insulation substrate.

As shown in FIG. 4, one or a plurality of thermal resistance detection element/elements 31 may be provided as the thermal resistance detection means to at least the periphery of the insulation substrate 12. Then, it is determined on the basis of the electric characteristics output of the thermal resistance detection element/elements 31, which depends on the thermal resistance thereof, that the thermal resistance of the heat radiating path is higher than a predetermined value. In this case, a temperature detection element such as a diode, which has the temperature-depending characteristics, is used as the thermal resistance detection element/elements 31. In addition, a thermal resistance measuring IC 30 is used, which circuit applies to the temperature detection circuit a plurality of pulses until the temperature detection circuit becomes stable in temperature. The measuring circuit 30 compares the forward bias voltage drop of the diode after applying the first pulse with the forward bias voltage drop of the diode after applying the last pulse, to detect the increase of the thermal resistance.

As indicated by a solid line in FIG. 4, when one thermal resistance measuring IC 30 and one thermal resistance detection element 31 are arranged on the periphery of the insulation substrate 12, the increase of the heat radiating path is detected by comparing the thermal resistance obtained by the thermal resistance measuring IC 30 on the basis of the detection output of the thermal resistance detection element 31 with a reference value.

Further, as indicated by a broken line in FIG. 4, when at least one thermal resistance detection element 32 and at least one thermal resistance measuring IC 33 are arranged in the portion other than the periphery of the insulation substrate 12 (the central portion of the insulation substrate 12, for example) in addition to the thermal resistance detection element 31 and the thermal resistance measuring IC 30 which are arranged on the periphery of the insulation substrate 12, the thermal resistance detected on the basis of the output of the thermal resistance detection element 32 is used as a reference value for determination. More specifically, by comparing the thermal resistance obtained on the basis of the output of one thermal resistance detection element 31 arranged on the periphery of the insulation substrate 12 with the reference value (i.e., the thermal resistance obtained on the basis of the output of one thermal resistance detection element 32 arranged on the portion other than the periphery of the insulation substrate 12), the increase of the thermal resistance of the heat radiating path is detected.

Figure 5:
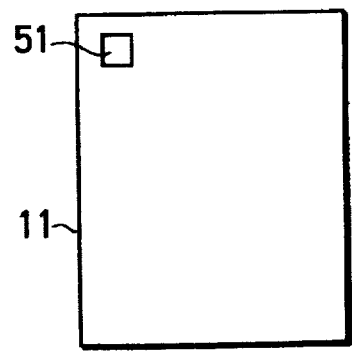
FIG. 5 shows the arrangement of the thermal resistance detection element as the thermal resistance detection means provided on the semiconductor chip of the power semiconductor device shown in FIG. 1.
Figure 7:
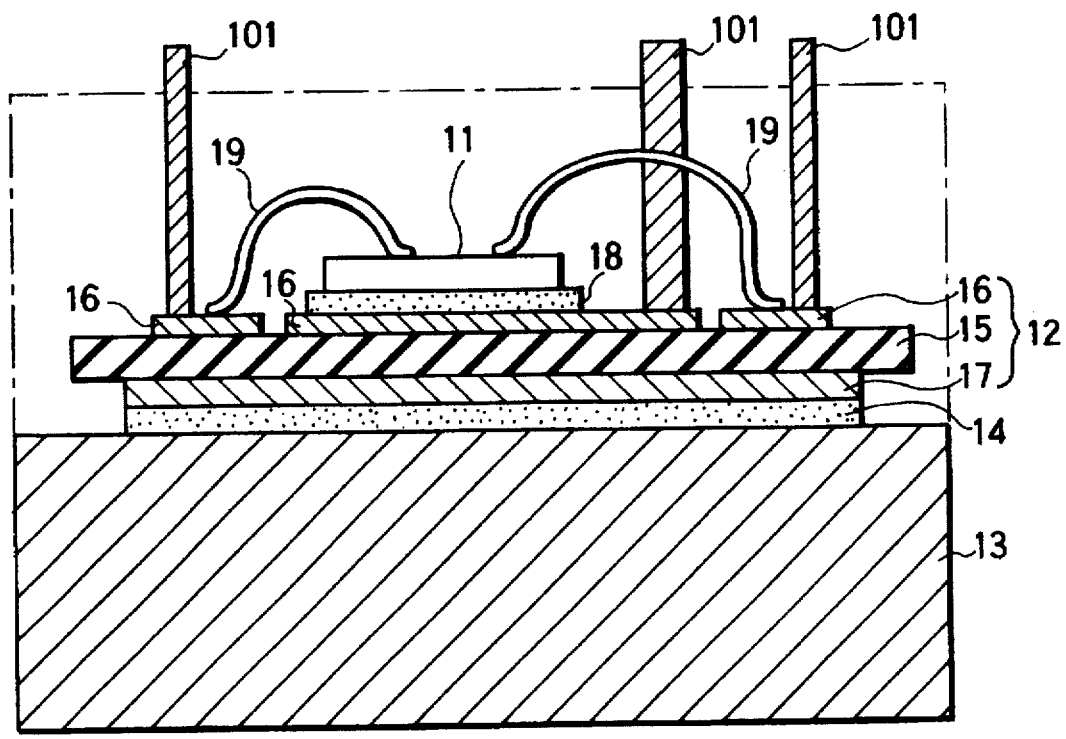
FIG. 7 is a sectional view of the conventional power semiconductor device.

As still another example of the thermal resistance detection means, FIG. 5 shows that at least one temperature detection/thermal resistance detection element 51 is arranged on the periphery of the semiconductor chip 11. In addition, a thermal resistance measuring IC (not shown) may be provided on the semiconductor chip. The element 51 or the measuring circuit determines that the thermal resistance of the heat radiating path is higher than a predetermined value on the basis of the output of the element 51.

If in this case crack has occurred on the periphery of the first solder layer 18, the heat radiating efficiency of the heat radiating path will decrease, and the temperature of the heat radiating path will increase. As a result, the increase of the thermal resistance of the heat radiating path can be detected.

While, as an example of the thermal resistance detection result output means of the above-mentioned embodiment, a combination of a bonding wire 19 and a detecting terminal 102 is shown in FIG. 1. The bonding wire 19 connects the detection element 21 (or the detection element 31/32 or the measuring IC 30/33, as shown in FIG. 4) to the metal pattern 16 for connecting the detecting terminal 102. The detection result is outputted from the detection element (or the measuring IC) to the outside of the semiconductor device through the metal pattern 16 connected with the terminal 102.

FIG. 6 shows a cross-section of a semiconductor device according to a second embodiment of the present invention. In this embodiment, the detection of the thermal resistance may be attained in such a manner that the alarm signal (such as audio signal and visual signal) is generated by properly processing the output of the detection element 21 or 31, and outputted to the alarm apparatus 103 (such as a light emitting diode) located on the outside of the semiconductor device through the detecting terminal 102.

Consequently, with the above-mentioned semiconductor device, the increase of the thermal resistance of the heat radiating path which is provided to radiate the heat generated in a power semiconductor device, and the deterioration of the semiconductor device due to the crack in the solder layer which bonds the chip mounting insulation substrate and the heat sink during the operation of the device, can be detected and outputted to the outside of the device. Therefore, according to the present invention, the user can take a suitable action such as exchange before the thermal resistance of the entire power semiconductor device decreases.

The semiconductor device having various types of protection functions has been eagerly required. In recent years, this demand of the users increases more and more. The present invention can satisfy this demand of the users, and realizes the power semiconductor device with high reliability.

As described above, the semiconductor device of the present invention can detect at the early stage the increase of the thermal resistance of the heat radiating path which is provided to radiate the heat generated in a power semiconductor device, and the deterioration of the semiconductor device due to the crack in the solder layer bonding the chip mounting insulation substrate and the heat sink during the operation of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor chip;
   a heat sink;
   an insulation substrate having high thermal conductivity and being provided between the semiconductor chip and the heat sink so as to hold the semiconductor chip;
   a solder layer for bonding the insulation substrate to the heat sink;
   thermal resistance detection means for detecting an increase of thermal resistance of a heat radiating path including the insulation substrate, the solder and the heat sink, the thermal resistance detection means being provided on a peripheral portion of the insulation substrate and being electrically insulated from the semiconductor chip; and
   thermal resistance detection result output means for outputting a result of a detection by the thermal resistance detection means externally of the semiconductor device.

2. A semiconductor device according to claim 1, wherein the thermal resistance detection means determine on the basis of temperature detection output of one or a plurality of temperature detection element/elements arranged at least on a periphery of the insulation substrate that the thermal resistance in the heat radiating path is higher than a reference value.

3. A semiconductor device according to claim 1, wherein the thermal resistance detection means determine that the thermal resistance in the heat radiating path is higher than a reference value on the basis of an electric characteristics output depending on a thermal resistance of one or a plurality of temperature detection element/elements arranged at least on a periphery of the insulation substrate.

4. A semiconductor device according to claim 1, wherein the thermal resistance detection means determine that the thermal resistance in the heat radiating path is higher than a reference value by use of temperature detection element/elements arranged on a periphery of the semiconductor chip.

5. A semiconductor device comprising:
   a semiconductor chip;
   an insulation substrate having an element mounting surface on which a metal pattern is formed, and a back surface on which a metal layer is formed;
   a first solder layer for bonding the insulation substrate to the semiconductor chip in a state where the semiconductor chip is mounted on the metal pattern for mounting the chip;
   bonding wires provided between the metal pattern on the insulation substrate for mounting the semiconductor chip and a pad section of the semiconductor chip;
   a heat sink;
   a second solder layer for bonding the metal on the back surface of the insulation substrate to the heat sink in a state where the metal on the back surface of the insulation substrate contacts on the heat sink;
   thermal resistance detection means for detecting an increase of thermal resistance of a heat radiating path including the insulation substrate, the first solder, the second solder and the heat sink, the thermal resistance detection means being provided on a peripheral portion of the insulation substrate and being electrically insulated from the semiconductor chip; and
   thermal resistance detection result output means for outputting a result of a detection by the thermal resistance detection means externally of the semiconductor device.

* * * * *